United States Patent
Zauber

(10) Patent No.: US 7,247,056 B2
(45) Date of Patent: Jul. 24, 2007

(54) RUGGED, REMOVABLE, ELECTRONIC DEVICE

(75) Inventor: Vonn A. Zauber, DeSoto, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/951,155

(22) Filed: Sep. 27, 2004

(65) Prior Publication Data

US 2006/0068644 A1    Mar. 30, 2006

(51) Int. Cl.
*H01R 25/00*    (2006.01)

(52) U.S. Cl. ...................................... 439/654

(58) Field of Classification Search ............... 439/654, 439/638, 620, 710, 320, 937
See application file for complete search history.

(56) References Cited

U.S. PATENT DOCUMENTS

| | | | | |
|---|---|---|---|---|
| 4,595,839 A * | 6/1986 | Braun et al. | ................ | 250/551 |
| 4,756,593 A * | 7/1988 | Koakutsu et al. | ........... | 385/139 |
| 5,197,895 A * | 3/1993 | Stupecky | .................... | 439/194 |
| 6,466,437 B1 * | 10/2002 | Sakuragi et al. | ............ | 361/686 |
| 6,790,077 B1 * | 9/2004 | Chen | ........................... | 439/502 |
| 6,875,023 B1 * | 4/2005 | Brown | ........................ | 439/61 |
| 6,916,210 B2 * | 7/2005 | Moore et al. | ............... | 439/685 |
| 2002/0004891 A1 * | 1/2002 | Hayashi | ..................... | 711/163 |
| 2004/0038592 A1 * | 2/2004 | Yang | .......................... | 439/638 |
| 2004/0083320 A1 * | 4/2004 | Yu | ............................. | 710/62 |
| 2004/0175977 A1 | 9/2004 | Eaton et al. | ................ | 439/180 |

FOREIGN PATENT DOCUMENTS

EP    1432082    6/2004

OTHER PUBLICATIONS

EDO Corporation Global Technology Reach—Technical Services Operations, 2000, "Rugged USB Devices".
Edo Corporation Global Technology Reach—"Rugged USB Devices".

* cited by examiner

*Primary Examiner*—Tulsidas C. Patel
*Assistant Examiner*—Phuongchi Nguyen
(74) *Attorney, Agent, or Firm*—Williams, Morgan & Amerson, P.C.

(57) ABSTRACT

An apparatus is disclosed, including a rugged electrical connector supporting an external bus protocol including a power signal; a backshell canister mated to the electrical connector; an active electronic component housed in the canister; and an electrical connection between the active electronic component and the rugged electrical connector.

14 Claims, 2 Drawing Sheets

RUGGED, REMOVABLE, ELECTRONIC DEVICE

BACKGROUND OF THE INVENTION

1. Field of the Invention

The present invention pertains to electronic devices for use in harsh, demanding environments.

2. Description of the Related Art

The application of computing technology continues to expand into ever harsher environments. At one time, computers and other computing devices were housed in separate, dedicated, climate controlled rooms. People wishing to use such machines would go to where they were located to interact with them. Considerable effort was made to cater to the environmental needs of the machines, even to the point of inconveniencing the users. Accordingly, not much concern was given to designing computers and computing devices to withstand the rigors of harsh environments.

Increasing demands on computing technology have changed all that. Today, computing devices are being deployed in ever harsher environments with one or more conditions such as extreme temperatures, high shock, high vibration, excessive humidity, and chemical exposure. For instance, computers are commonly found in oilfield applications where they are subjected to extremes of temperature, shock and vibration. Computing technology has also found growing application in military applications, including weapons systems that are particularly high performance. Military applications, as well as some civilian applications, also add the additional pressure of life and death stakes as a function of performance level.

Much effort has therefore gone into "ruggedizing" computing technology. Sometimes this results in changes to the designs of the computing devices, connectors, buses, storage devices, etc. For instance, the design of a microprocessor might be changed to enable to withstand higher or lower temperatures found in a particular harsh environment. Sometimes the effort results in techniques for installing an existing design. For example, an existing microprocessor might be mounted in a way that helps isolate it from vibration. Cumulatively, these kinds of changes significantly impact the performance of computing technology in demanding environments.

One complicating factor is the reality that ruggedization is but one factor in the design of a computing apparatus. The engineering task usually involves a multitude of tradeoffs among competing considerations that will be implementation specific. Thus, a particular ruggedization technique may not be acceptable if it results in excessive size and weight for, e.g., a missile whereas it may be acceptable if used in, e.g., an armored ground vehicle. Thus, it is not enough that a particular ruggedization technique is available and will work, it must also not force unacceptable tradeoffs with other engineering constraints. Preferably, the ruggedization technique will actually facilitate or enhance the design's ability to meet other engineering constraints. However, even if it facilitates the design effort in multiple areas, it may still be unacceptable if it undesirably impacts the computational performance of computing apparatus.

Another complicating factor is that the computing apparatus as a whole must be ruggedized. It does little good to ruggedize the computing device (e.g., the processor or controller) if the storage is not. Storage is equally important in the performance of a computing apparatus since the computing device is dependent upon the storage for, among other things, the data on which it operates. This becomes more important as computing technologies are applied to more computationally intensive problems that process higher volumes of data that require greater storage. Furthermore, the electrical connection between the computing device and the storage is dependent upon the buses and connectors through which the electrical connection is made. The ruggedization of each of these aspects of the computing apparatus involves different considerations such that techniques applicable to, for example, the computing device, may not be applicable to, for instance, the connectors.

To illustrate the difficulties of balancing these factors, consider the relatively recent development of removable mass storage. To facilitate portability, the mass storage device should be small and lightweight. To facilitate interoperability, the mass storage device should be relatively platform independent, i.e., to be usable with a variety of platforms. It should provide stable connections, high numbers of accesses, and fast accesses. For present purposes, it should be able to withstand extremes of temperature, high shock, high vibration, and high humidity. It should also cost relatively little.

Some "ruggedized" Universal Serial Bus ("USB") flash drive, removable mass storage devices have been developed. These solutions are typically sufficiently small, light, and platform independent. Some have hardened packages for increased durability and, presumably, better tolerance for shock. However, they also employ the standard USB connector and interface. The standard USB interface is not suitable for military applications and for most harsh environments. Among other problems, the connectors are fragile and the connections they make are susceptible to failure in the face of high vibration and/or shock.

Some military solutions have been developed to address the deficiencies of these ruggedized USB flash drives. These solutions admirably address those deficiencies and are typically built on a removable flash card, such as a Compact Flash, Personal Computer Memory Card International Association ("PCMCIA"), etc. card. They generally include a host chassis with a removable cartridge assembly. However, they usually include a heavy internal power supply. They also tend to be bulky, large, expensive, and platform dependent.

The present invention is directed to resolving, or at least reducing, one or all of the problems mentioned above.

SUMMARY OF THE INVENTION

The invention includes an apparatus, comprising: a rugged electrical connector supporting an external bus protocol including a power signal; a backshell canister mated to the electrical connector; an active electronic component housed in the canister; and an electrical connection between the active electronic component and the rugged electrical connector.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1:
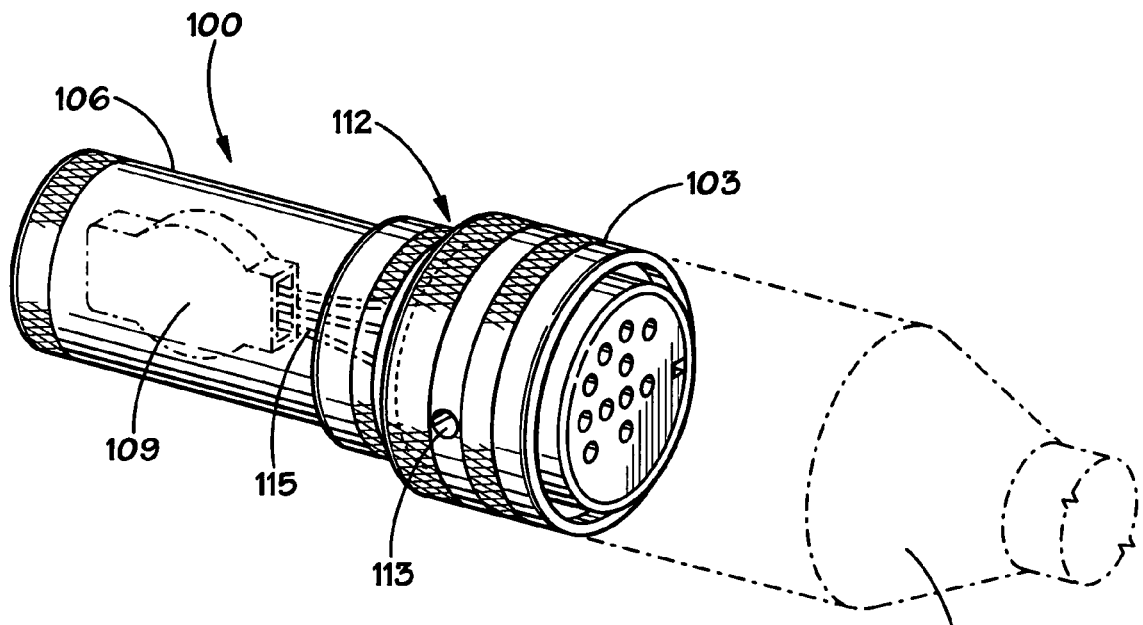
FIG. 1 is an assembled, perspective view of one particular embodiment of the present invention.
Figure 2:
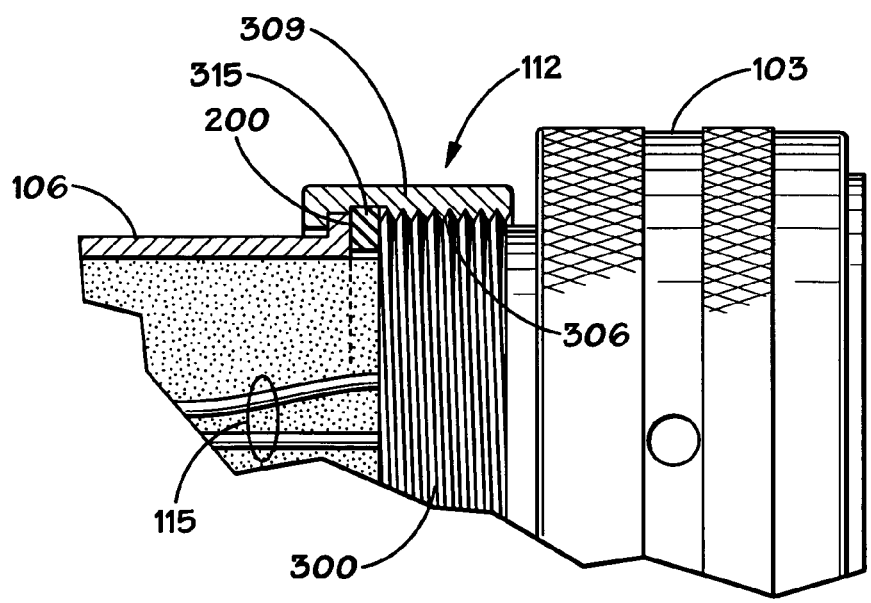
FIG. 2 is a partially sectioned, plan view of the embodiment in FIG. 1.
Figure 3:
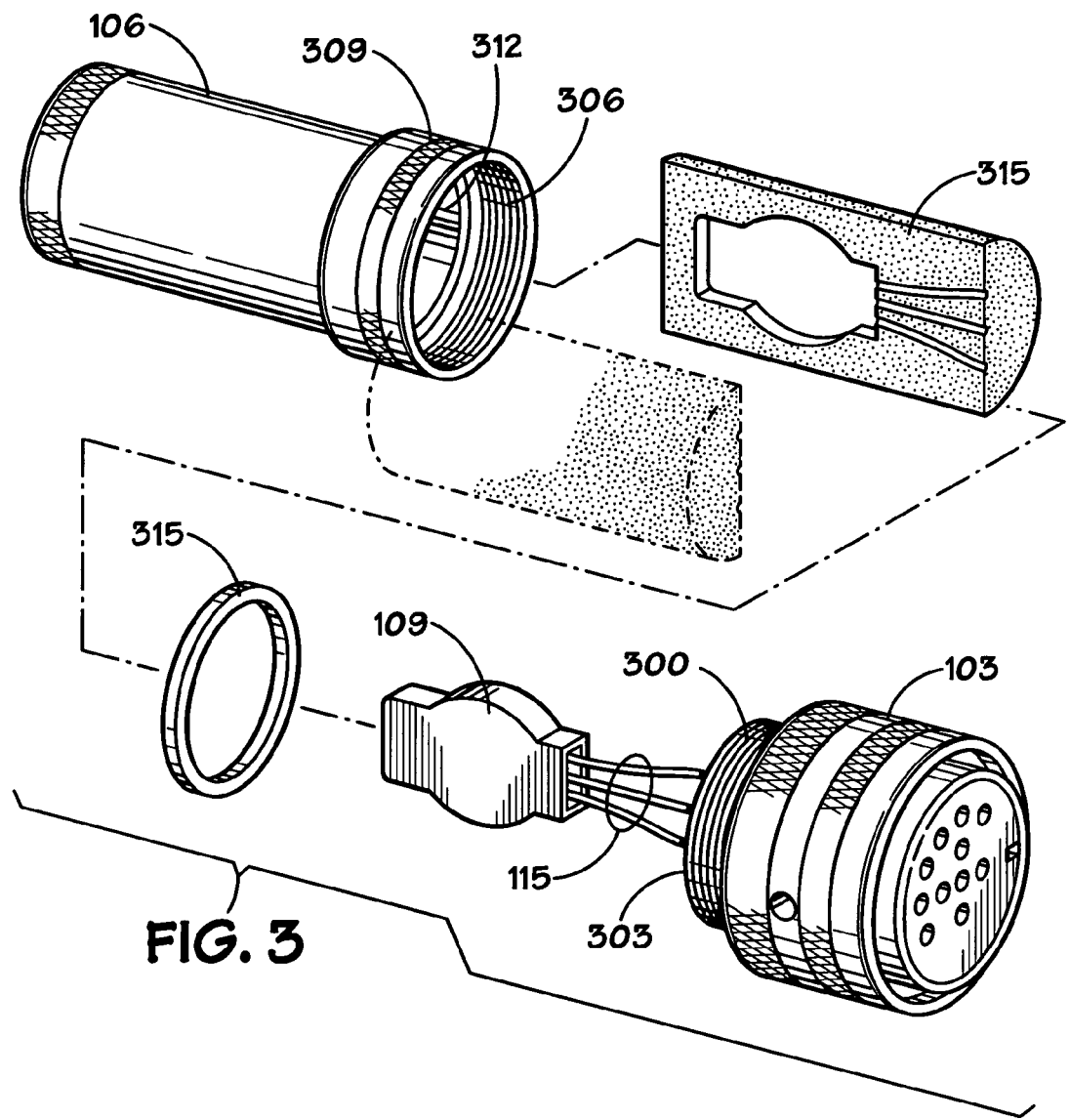
FIG. 3 is an exploded, perspective view of the embodiment of FIG. 1.

Turning now to the drawings, FIG. 1–FIGS. 3 illustrate a first embodiment of a removable electronic apparatus 100 constructed in accordance with the present invention. The electronic apparatus 100 comprises a rugged electrical connector 103 supporting an external bus protocol including a power signal. A backshell canister 106 is mated to the rugged electrical connector 103. An active electronic component 109 electrically connected to the rugged electrical connector 103 is then housed in the backshell canister 106.

The rugged electrical connector 103 is sufficiently rugged to withstand elevated levels of shock, vibration, impact, etc. and consequently be resistant to damage by crushing, deformation, breakage, disassembly from vibration, etc., found in harsh, demanding environments. To some degree, the level of ruggedness will be implementation specific. Different levels of shock and vibration will be found, for instance, on the deck of drilling rig in hydrocarbon exploration and production than will be found on the floor of a machine shop. However, various military organizations routinely specify standards with respect to these kinds of conditions that are referred to as a "military specification," or "mil spec", and mil specs can be referred to where applicable, even in civilian contexts, although compliance with mil specs is not necessary to the practice of the invention. For instance, standards are also set b the American Society of Testing and Materials ("ASTM").

In the illustrated embodiment, the rugged electrical connector 103 is a cylindrical connector, and, more particularly, a circular connector. Suitable circular connectors are commercially available off the shelf from a number of vendors, such as Amphenol Aerospace, a division of:

Amphenol Corporation
358 Hall Avenue
Wallingford, Conn. 06492
U.S.A.
ph: (877) 267-4366
ph: (203) 265-8900
fax: (203) 265-8516
e-mail: aphinfo@amphenol.com or, alternatively:
Glenair, Inc.
1211 Air Way
Glendale, Calif. 91201
U.S.A.
ph: (818) 247-6000
fax: (818) 500-9912

In general, circular connectors come in a bayonet-style or a threaded-style, and the illustrated embodiment is a bayonet-style circular connector. Thus, the apertures 113 (only one shown) that mate with ears (not shown) on the mating connector 117, shown in FIG. 1 in ghosted lines. Other types of connectors might be employed in alternative embodiments.

The rugged electrical connector 103 of the illustrated embodiment also possesses a number of characteristics that, while not necessary to the practice of the invention, may be desirable in some embodiments. For instance, the rugged electrical connector 103 is environmentally resistant, e.g., waterproof, not susceptible to shock or vibration, etc. The rugged electrical connector 103 is also self-aligning, scoop-proof, and keyed. This particular embodiment furthermore is constructed to comply with the MIL Standard MS27467 (MIL-DTL-38999, Series I), promulgated by the United States Armed Forces. However, compliance with numerous other MIL standards and industrial standards may also be suitable in alternative embodiments.

As noted above, the cylindrical electrical connector supports an external bus protocol including a power signal. Exemplary external bus protocols include, but are not limited to, the Universal Serial Bus ("USB") protocol and the IEEE 1394 protocol (e.g., FireWire, etc.). External bus protocols specify a number of characteristics, both physical and electrical, that a bus must meet to be compliant therewith. Note that the term "external bus protocol" is used as in the computing arts, e.g., to mean a bus that connects a computing device to a peripheral device. Note also that the USB and IEEE 1394 protocols are open standards, meaning they are available to the public. They have also achieved a wide acceptance such that their use in the present invention makes the apparatus 100 compatible with a wide array and number of computing devices.

The backshell canister 106 of the illustrated embodiment is also commercially available off the shelf, and typically from the same vendor from which the connector 103 is obtained. The backshell canister 106 in the illustrated embodiment is, like the rugged electrical connector 103, environmentally resistant. This particular embodiment furthermore is constructed to comply with the MIL Standard MS27467 (MIL-DTL-38999, Series I), promulgated by the United States Armed Forces. However, compliance with numerous other MIL standards and industrial standards may also be suitable in alternative embodiments.

The backshell canister 106 and the rugged electrical connector 103 are joined through a threaded connection 112, best shown in FIG. 2. As is shown best in FIG. 3, the rugged electrical connector 103 includes a male thread 300 on the outer circumference of a drum 303. The backshell canister 106 includes a female thread 306 on the inner circumference of a rotating ring 309 at the open end 312 of the backshell canister 106. The threaded connection 112 is formed by rotating one of the rugged electrical connector 103 and the backshell canister 106 relative to the other in conventional fashion. In the illustrated embodiment, the rotating ring 309 is rotated onto the drum 303 to make the threaded connection 112. The outer surface of the rotating ring 309 is knurled or scored to improve the user's grip and thereby facilitate this function. The threaded connection 112 compresses an O-ring 315 between a shoulder 200 and an end of drum 303, best shown in FIG. 2, to make the threaded connection 112 watertight and airtight.

In various embodiments, the backshell canister 106 and/or outer portions of the electrical connector 103 may comprise materials such as aluminum, an aluminum alloy, a stainless steel, or the like and may be coated (e.g. anodized, etc) to inhibit corrosion and wear. Alternatively, the backshell canister 106 (or portions thereof) may comprise one or more of a radiopaque material, a translucent material, and a transparent material to facilitate communication between the active electronic component 109 and a computing device (not shown), as will be discussed in more detail below. The materials will be implementation specific and still other types of materials may be used in alternative embodiments.

The electronic component 109 is, in the illustrated embodiment, electrically connected to the rugged electrical connector 103 by a plurality of leads 115. The number of leads 115 will be a function of the external bus protocol supported by the electronic apparatus 100. Note that the electrical connection between the electronic component 109 may be implemented using techniques other than the leads 115. For instance, other embodiments might employ pins or finger edge connectors (e.g., gold-plated finger edge connectors), depending on the implementation of the active electronic component 109 and the rugged electrical connector 103.

In one particular embodiment, a rigid flex harness (not shown) is used to implement the electrical connection between the rugged electrical connector 103 and the active electronic component 109. A rigid flex harness permits control over impedances and have repeatability in terms of assembly. Two of protocols suitable for use in the present invention, USB 2.0 and Firewire, have high data rate potential and signal integrity can be tightly maintained by designing a rigid flex harness to pick up the back of the rugged electrical connector 103 and mate with whatever electronic assembly (i.e., the active electronic component 109) is inside the backshell canister 106.

The electronic component 109 is an active, as opposed to passive, electronic device. In the illustrated embodiment, the electronic component 109 is a memory device. In the illustrated embodiment, the memory device is commercially available off the shelf in the form of a USB flash drive. The electronic component 109 may be obtained by stripping away the shell and connector of a commercially available USB flash drive, leaving only the memory device that is then assembled into the present invention. Alternatively, the electronic device 109 may be obtained without the shell and connector, then assembled into the present invention.

Figure 4:
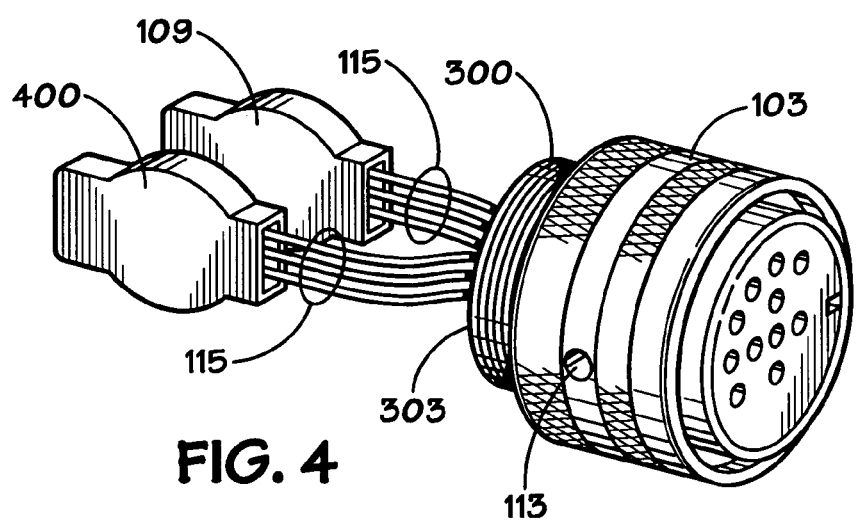
FIG. 4 is a partially disassembled, perspective view of a second embodiment in accordance with the present invention.

However, the invention is not limited to memory devices or even a single electronic device. Furthermore, as is shown in FIG. 4, alternative embodiments may employ a second electronic component 400 that may or may not be the same as the electronic component 109. Thus, the active electronic component 109 may, in some embodiments, actually constitute and assembly of multiple electronic devices, at least one of which is an active.

The electronic component 109 can be, in some embodiments, a wirelessly transmitter, receiver, or transceiver permitting a wireless link between the apparatus (not shown) to which the apparatus 100 is too be connected and a remote location. For instance, the apparatus 100 may be equipped with a small antenna (not shown) and the backshell canister 106 made of some non-metallic material. In this way, a via an USB interface, a field device (such as a data logger) can establish a wireless Ethernet link to a field engineer with a commercial laptop, etc.

Alternatively, an IrDA ("Infrared Data Association") standard connection, which is the standard that PDAs ("Personal Digital Assistants"), notebook computers, printers, etc. use to wirelessly link up, may be employed.

The backshell canister 106 in such embodiments may be constructed from a metal material provided an IR ("Infrared") window is provided; or, the whole backshell canister 106 may be made of an IR transparent material. For instance, Germanium (Ge) is commonly used for lenses and windows in IR systems operating in the 2–12 µm range and would be suitable for is this application. The operational environment will not be problematical because Germanium is inert, mechanically rugged, and fairly hard. It is an excellent choice for multi-spectral systems and for applications where electromagnetic interference ("EMI") shielding is necessary.

Germanium can also be electrically heated for anti-fogging or anti-icing applications.

The electronic component 109 is stabilized within the backshell canister 106 by a potting material 315, best shown in FIG. 3. The potting material 315 is, by way of example and illustration, but one means for stabilizing the electronic component 109. Other means may include, for instance, expanded foam or a brace. Some embodiments may omit means for stabilizing the electronic device altogether. When used, the choice of stabilizing means will be implementation specific. For instance, in the illustrated embodiment, the potting material 315 is selected to help transfer heat generated by the electronic component 109 is transferred away from the electronic component 109. However, in some harsh environments with extreme temperatures, this may be undesirable. Also, weight and size constraints may impact the choice of stabilizing means. Still other considerations may come into play in some embodiments.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A removable mass storage device, comprising:
   a circular rugged electrical connector supporting an external bus protocol including a power signal;
   a backshell canister mated to the circular electrical connector;
   a memory device housed in the canister;
   an electrical connection between the memory device and the circular electrical connector; and
   means for stabilizing the memory device within the canister.

2. The removable mass storage device of claim 1, wherein at least one of the circular electrical connector and the backshell canister is environmentally resistant.

3. The removable mass storage device of claim 1, wherein the circular electrical connector is one of a bayonet-style and a threaded-style circular connector.

4. The removable mass storage device of claim 1, wherein the circular electrical connector is at least one of self-aligning, keyed, and scoop-proof.

5. The removable mass storage device of claim 1, where in the circular electrical connector supports a Universal Serial Bus protocol or an IEEE 1394 protocol.

6. The removable mass storage device of claim 1, wherein the external bus protocol comprises an open standard protocol.

7. The apparatus of claim 1, wherein the electrical connection includes a plurality of leads, finger edge connectors, or a rigid flex harness.

8. The apparatus of claim 1, wherein the stabilizing means includes at least one of a potting material, an expanded foam, and a brace.

9. An apparatus, comprising:
a rugged electrical connector supporting an external bus protocol including a power signal;
a backshell canister mated to the electrical connector;
an active electronic component housed in the canister, wherein the active electronic component comprises a memory device, a portion of a wireless transmitter, a portion of a wireless receiver, or a portion of a wireless transceiver; and
an electrical connection between the active electronic component and the rugged electrical connector.

10. The apparatus of claim 9, wherein the rugged electrical connector comprises a cylindrical electrical connector.

11. The apparatus of claim 9, wherein at least one of the rugged electrical connector and the backshell canister is environmentally resistant.

12. The apparatus of claim 9, wherein the rugged electrical connector is at least one of self-aligning, keyed, and scoop-proof.

13. The apparatus of claim 9, wherein the active electronic component comprises a portion of an electronic assembly.

14. The apparatus of claim 9, further comprising means for stabilizing the active electronic component in the backshell canister.

* * * * *